(12) United States Patent
Yamagami (10) Patent No.: US 7,643,372 B2
(45) Date of Patent: Jan. 5, 2010

(54) SEMICONDUCTOR INTEGRATED CIRCUIT

(75) Inventor: Yoshinobu Yamagami, Osaka (JP)

(73) Assignee: Panasonic Corporation, Osaka (JP)

( * ) Notice: Subject to any disclaimer, the term of this patent is extended or adjusted under 35 U.S.C. 154(b) by 141 days.

(21) Appl. No.: 12/100,312

(22) Filed: Apr. 9, 2008

(65) Prior Publication Data

US 2008/0253172 A1  Oct. 16, 2008

(30) Foreign Application Priority Data

Apr. 12, 2007  (JP) ............................. 2007-104823

(51) Int. Cl.
   *G11C 8/08* (2006.01)
(52) U.S. Cl. ............................. 365/230.06; 365/189.15; 365/189.16; 365/189.06
(58) Field of Classification Search .......... 365/230.06, 365/189.15, 189.16, 189.06
   See application file for complete search history.

(56) References Cited

U.S. PATENT DOCUMENTS

| | | | | |
|---|---|---|---|---|
| 6,097,636 | A * | 8/2000 | Nojima ................... | 365/185.23 |
| 6,597,610 | B2 | 7/2003 | Houston | |
| 7,085,175 | B2 * | 8/2006 | Remington et al. .... | 365/189.09 |
| 7,180,768 | B2 | 2/2007 | Kotabe et al. | |
| 2002/0186581 | A1 | 12/2002 | Yamaoka et al. | |
| 2005/0024917 | A1 | 2/2005 | Yamaoka et al. | |
| 2005/0213415 | A1 | 9/2005 | Matsuzawa et al. | |
| 2007/0030741 | A1 * | 2/2007 | Nii et al. ................ | 365/189.11 |
| 2007/0133260 | A1 | 6/2007 | Yamaoka et al. | |

FOREIGN PATENT DOCUMENTS

| | | |
|---|---|---|
| JP | 2002-368135 | 12/2002 |
| JP | 2005-276277 | 10/2005 |

OTHER PUBLICATIONS

Suzuki, T. et al., "A Stable SRAM Cell Design Against Simultaneously R/W Disturbed Accesses," IEECE., vol. 106, No. 206, pp. 137-141, Aug. 10, 2006 with English Translation.
Yamauchi, H. et al., "A 1R/1W SRAM Cell Design to Keep Cell Current and Area Saving against Simultaneous Read/Write Disturbed Accesses," IEICE Trans Electron., vol. E90-C, No. 4, pp. 749-757, Apr. 1, 2007.

* cited by examiner

*Primary Examiner*—Amir Zarabian
*Assistant Examiner*—Jay Radke
(74) *Attorney, Agent, or Firm*—McDermott Will & Emery LLP (57) ABSTRACT

A semiconductor integrated circuit includes a plurality of memory cells arranged in a matrix, a plurality of word lines corresponding to respective rows of the plurality of memory cells, a plurality of word line drivers for driving the plurality of word lines, respectively, and a plurality of pull-down circuits connected to the plurality of word lines, respectively, for causing voltages of the respective connected word lines to be lower than or equal to a power supply voltage when the respective word lines are in an active state. The word line drivers each have a transistor for causing the corresponding word line to go into the active state. The pull-down circuits each have a pull-down transistor for pulling down the corresponding word line, the pull-down transistor being a transistor having the same conductivity type as that of the transistor included the word line driver for driving the corresponding word line.

12 Claims, 6 Drawing Sheets

SEMICONDUCTOR INTEGRATED CIRCUIT

CROSS REFERENCE TO RELATED APPLICATIONS

This Non-provisional application claims priority under 35 U.S.C. §119(a) on Patent Application No. 2007-104823 filed in Japan on Apr. 12, 2007, the entire contents of which are hereby incorporated by reference.

BACKGROUND OF THE INVENTION

1. Field of the Invention

The present invention relates to a semiconductor integrated circuit having flip-flop memory cells and, more particularly, to a technique of controlling the voltage of a word line.

2. Description of the Related Art

In recent years, as the process rule is reduced, the areas and the power supply voltages of semiconductor integrated circuits are rapidly reduced. This leads to detrimental effects. For example, in a semiconductor integrated circuit having flip-flop memory cells, such as a static random access memory (hereinafter referred to as an SRAM), it has been considerably difficult to impart stable characteristics to the memory cells due to variations in characteristics of transistors included in the memory cells or the reduction of the power supply voltage. As a result, the yield of the semiconductor integrated circuit is reduced.

In general, it is known that the threshold voltage Vt of a transistor varies in proportion to $1/\sqrt{(W \times L)}$, where W is the width of the transistor and L is the length of the transistor. In other words, as the transistor width W and the transistor length L are reduced with a reduction in the process rule, a variation in the transistor threshold voltage Vt becomes more significant.

Thus, when the reduced process rule is used, it is considerably important to suppress variations in elements included in a semiconductor integrated circuit in order to achieve stable characteristics and performance of the semiconductor integrated circuit.

SRAMs have a static noise margin (hereinafter also referred to as an SNM) as a characteristic of a memory cell. The SNM is an index indicating the magnitude of a margin with respect to noise. The larger the value of the SNM, the higher the data holding performance of the memory cell (e.g., as data held in a flip-flop of a memory cell becomes more unlikely to be inverted due to noise from a bit line pair when a word line is in the active state, the data holding performance becomes higher). The SNM is generally improved by reducing the conductance of an access transistor included in a memory cell of an SRAM.

As a technique of improving the SNM, the following examples are known. Japanese Unexamined Patent Application Publication No. 2002-368135 (Patent Document 1) describes that different power supply voltages are supplied separately to a peripheral circuit and a memory array of an SRAM (a power supply voltage for the peripheral circuit is set to be lower than a power supply voltage for the memory array). It is also described that a step-up power supply circuit or a step-down power supply circuit is provided so as to cause the power supply voltage for the peripheral circuit to be lower than the power supply voltage for the memory array.

A word line for controlling the gate terminal of the access transistor is driven by a power supply for the peripheral circuit of the SRAM. Therefore, the voltage of the word line in the active state is lower than the power supply voltage for the memory array. Therefore, the conductance of the access transistor controlled by the word line is reduced, resulting in an improvement in the SNM.

Also, Japanese Unexamined Patent Application Publication No. 2005-276277 (Patent Document 2) describes that a transfer gate including an n-channel metal oxide semiconductor transistor (hereinafter referred to as an NMOS transistor) and a p-channel metal oxide semiconductor transistor (hereinafter referred to as a PMOS transistor) is connected in series to a word line. The voltage value of the word line in the active state is controlled to be lower by an amount corresponding to the threshold voltage of the NMOS transistor than the power supply voltage, so that the conductance of the access transistor is reduced, resulting in an improvement in the SNM.

However, if two different power supply voltages cannot be supplied to an SRAM (only one power supply voltage is supplied), a method as described in Patent Document 1 cannot be used.

Also, if a step-up power supply circuit or a step-down power supply circuit is provided as in Patent Document 1, a power supply for the whole peripheral circuit or the whole memory array is controlled, resulting in an increase in power consumption. The provision of a step-up power supply circuit or a step-down power supply circuit also leads to an increase in layout area of the whole circuit.

If a transfer gate is used as in Patent Document 2, the voltage value of a word line in the active state can be set to be lower only by an amount corresponding to the threshold voltage of the NMOS transistor than the power supply voltage. Also, the transfer gate is connected in series to a word driver circuit for driving the word line, and therefore, the capability to drive the word line is reduced, leading to a deterioration in the rising or falling speed of the word line voltage.

Further, if the word line is caused to be in the active state for a long period of time, the word line voltage goes up to the power supply voltage level due to a leakage current via the transfer gate or the like. In other words, the word line voltage cannot be controlled to have a desired value (a value lower by an amount corresponding to the threshold voltage of the NMOS transistor than the power supply voltage). The influence of variations in elements constituting the circuit is not taken into consideration, and therefore, when the reduced process rule is used, it is considerably difficult to achieve the stable characteristics and performance of the semiconductor integrated circuit.

SUMMARY OF THE INVENTION

An object of the present invention is to provide a semiconductor integrated circuit having memory cells, in which a static noise margin can be improved irrespective of variations in transistor characteristics or variations in an operating environment.

Specifically, the semiconductor integrated circuit of the present invention includes a plurality of memory cells arranged in a matrix, a plurality of word lines corresponding to respective rows of the plurality of memory cells, a plurality of word line drivers for driving the plurality of word lines, respectively, and a plurality of pull-down circuits connected to the plurality of word lines, respectively, for causing voltages of the respective connected word lines to be lower than or equal to a power supply voltage when the respective word lines are in an active state. The plurality of word line drivers each have a transistor for causing the corresponding word line to go into the active state. The plurality of pull-down circuits each have a pull-down transistor for pulling down the corresponding word line, the pull-down transistor being a transistor having the same conductivity type as that of the transistor included the word line driver for driving the corresponding word line.

Thus, since the pull-down transistor for pulling down a word line is provided, the voltage variation of the word line in the active state can be suppressed, so that the static noise margin of the memory cell can be improved. The pull-down transistor has the same conductivity type as that of the transistor for causing the word line to go into the active state, so that the voltage of the word line in the active state can be optimally controlled irrespective of variations in transistor characteristics or a change in an operating environment, such as a power supply voltage, temperature or the like.

According to the present invention, the voltage of a word line in the active state can be optimized. Since the static noise margin of a memory cell can be improved, a semiconductor integrated circuit having stable memory cell characteristics and low power consumption can be achieved.

DETAILED DESCRIPTION OF THE PREFERRED EMBODIMENTS

Hereinafter, embodiments of the present invention will be described with reference to the accompanying drawings.

First Embodiment

Figure 1:
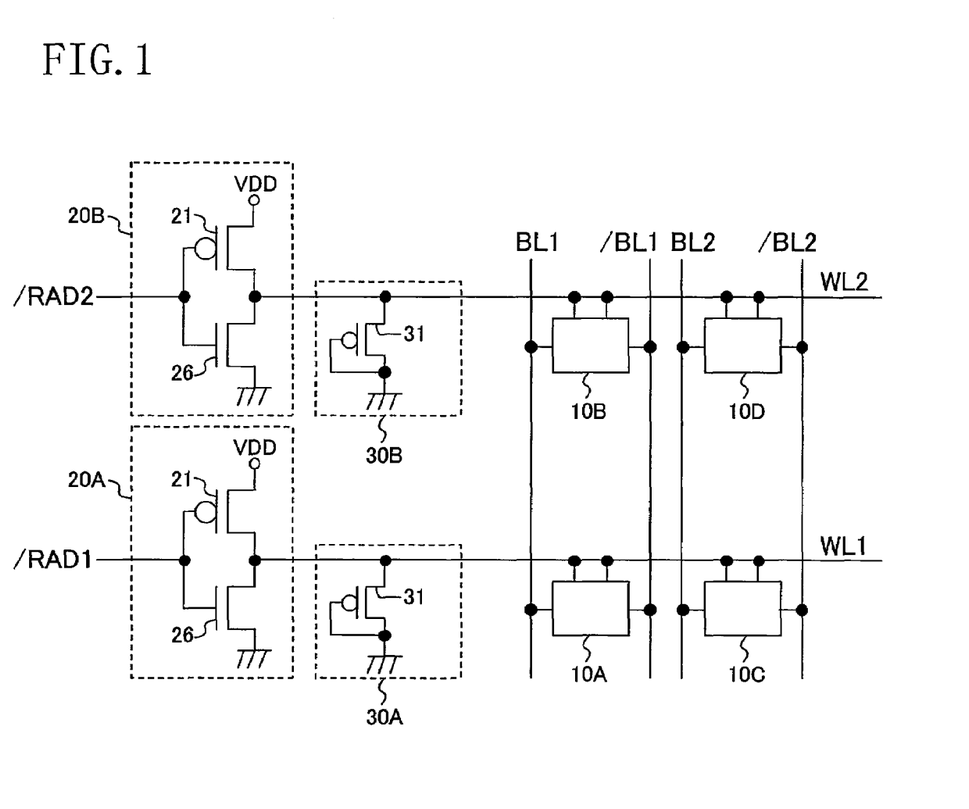
FIG. 1 is a block diagram showing a configuration of a semiconductor integrated circuit according to a first embodiment of the present invention.

FIG. 1 is a block diagram showing a configuration of a semiconductor integrated circuit according to a first embodiment of the present invention. The semiconductor integrated circuit of FIG. 1 has memory cells 10A, 10B, 10C and 10D, word line drivers 20A and 20B, and pull-down circuits 30A and 30B.

The word line drivers 20A and 20B each have a PMOS transistor 21 and an NMOS transistor 26. The pull-down circuits 30A and 30B each have a PMOS transistor 31 as a pull-down transistor.

In the word line drivers 20A and 20B, the PMOS transistor 21 and the NMOS transistor 26 constitute an inverter. The word line drivers 20A and 20B invert row address signals /RAD1 and /RAD2 and output the results to the word lines WL1 and WL2, respectively.

In the pull-down circuits 30A and 30B, the source terminals of the PMOS transistors 31 are connected to the word lines WL1 and WL2, respectively. The gate terminal and the drain terminal of the PMOS transistor 31 are both connected to the ground.

The memory cells 10A, 10B, 10C and 10D are provided at the intersections of the word lines WL1 and WL2 arranged in the row direction and a pair of bit lines BL1 and /BL1 arranged in the column direction and the intersections of the word lines WL1 and WL2 and a pair of bit lines BL2 and /BL2 arranged in the column direction, one memory cell for each intersection. Although not shown in FIG. 1, the semiconductor integrated circuit of FIG. 1 has more bit line pairs and word lines, and more memory cells similarly arranged in a matrix. These memory cells, which store information, constitute a memory array. Circuits similar to the word line driver 20A and the pull-down circuit 30A are connected to each word line.

Figure 2:
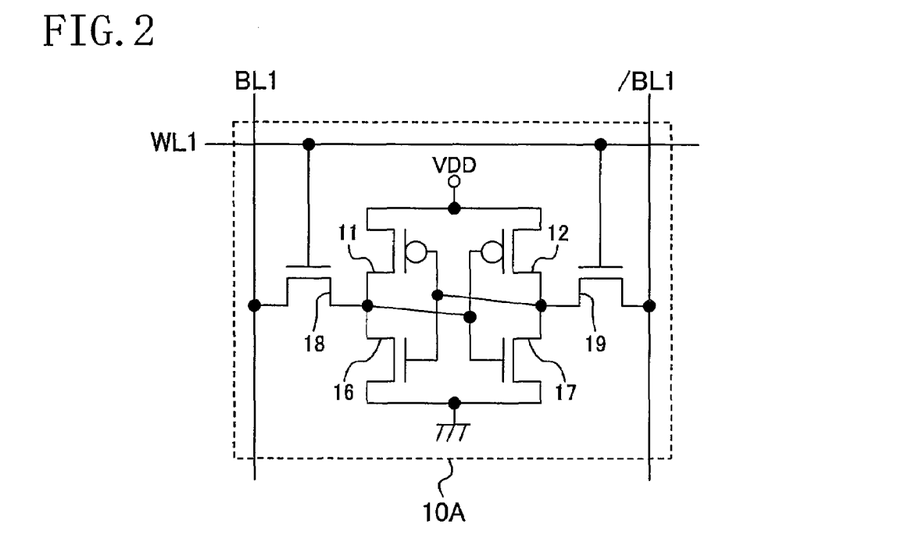
FIG. 2 is a circuit diagram showing a configuration of a memory cell of FIG. 1.

FIG. 2 is a circuit diagram showing a configuration of the memory cell 10A of FIG. 1. The memory cell 10A has load transistors 11 and 12, drive transistors 16 and 17, and access transistors 18 and 19.

The load transistor 11 and the drive transistor 16 constitute an inverter, and the load transistor 12 and the drive transistor 17 constitute an inverter. The input terminal and the output terminal of one inverter are connected to the output terminal and the input terminal of the other inverter, respectively, so that a flip-flop is constructed. This flip-flop stores and holds data.

Also, the gate terminals of the access transistors 18 and 19 are both connected to the word line WL1, and the drain terminals thereof are connected to the bit lines BL1 and /BL1, respectively. The source terminals of the access transistors 18 and 19 are connected to the output terminal of the two respective inverters.

Data is written into the memory cell 10A by causing the word line WL1 to go to the H level (active state) and causing the potential of one of the bit lines BL1 and /BL1 which is previously precharged to the H level to go from the H level to the L level. Also, data is read from the memory cell 10A by previously precharging the bit lines BL1 and /BL1 to the H level and causing the word line WL1 to go into the active state. The potential of one of the bit lines goes from the H level to the L level, depending on a state which is stored and held by the flip-flop in the memory cell.

The memory cells in the semiconductor integrated circuit of FIG. 1 are each an SRAM memory cell which has a configuration similar to that of the memory cell 10A of FIG. 2.

An operation of the semiconductor integrated circuit of FIG. 1 will be described. Firstly, a case where the word lines WL1 and WL2 are in the inactive state (L level) will be described. When the row address signals /RAD1 and /RAD2 are both at the H level, the word lines WL1 and WL2 are in the inactive state. In this case, the PMOS transistors 31 included in the pull-down circuits 30A and 30B are OFF and do not have an influence on the word lines WL1 and WL2.

Next, a case where a word line goes to the active state (H level) will be described. When either of the row address signals /RAD1 and /RAD2 goes to the L level, a corresponding word line goes into the active state. For example, it is here assumed that the row address signal /RAD1 goes to the L level.

When the row address signal /RAD1 goes to the L level, the PMOS transistor 21 included in the word line driver 20A is switched ON (the NMOS transistor 26 is switched OFF), so that the word line WL1 goes to the H level. In this case, the PMOS transistor 31 included in the pull-down circuit 30A which is connected to the word line WL1 is switched ON, so that this transistor pulls down the word line WL1. Therefore, the voltage of the word line WL1 becomes a voltage which is determined by the voltage division ratio of the PMOS transistors 21 and 31 (unless the pull-down circuit 30A is provided, the voltage of the word line WL1 is a power supply voltage VDD).

In general, the static noise margin (SNM) is improved by reducing the conductance of an access transistor included in an SRAM memory cell. According to the semiconductor integrated circuit of FIG. 1, the voltage of the word line WL1 is caused to be lower than the power supply voltage VDD, so that the conductance of the access transistor is reduced, resulting in an improvement in SNM.

Even when transistor characteristics vary due to variations in process or the like, characteristics of transistors having the same conductivity type are shifted in the same direction. Since the PMOS transistors 21 and 31 have the same conductivity type, a variation in voltage of the word line WL1 can be minimized.

In the word line driver 20A, an NMOS transistor may be used instead of the PMOS transistor 21. In this case, in the pull-down circuit 30A, an NMOS transistor may be used instead of the PMOS transistor 31.

The voltage of a word line may be set, depending on the SNM characteristics of a memory cell. By changing the capability of the PMOS transistor 31 included in the pull-down circuit 30A (e.g., the gate width W or the gate length L of the transistor is changed), the voltage of a word line can be set to have any value.

In general, when a PMOS transistor and an NMOS transistor have the same gate width W and the same gate length L, the drive capability of the NMOS transistor is about two times higher than that of the PMOS transistor. Therefore, if the gate width W of the NMOS transistor is assumed to be one, the gate width W of the PMOS transistor needs to be two so as to cause the PMOS transistor to have the same capability.

As described above, the threshold voltage Vt of a transistor varies in proportion to $1/\sqrt{(W \times L)}$. In other words, if a PMOS transistor whose gate width W needs to be large is used, a variation in the threshold voltage Vt of the transistor is reduced, so that variations in transistor characteristics are reduced. Therefore, when the PMOS transistors 21 and 31 are used, a variation in voltage of a word line can be suppressed.

Although it has been assumed above that the pull-down circuit 30A includes the PMOS transistor 31, a resistance element or an NMOS transistor may be used instead of the PMOS transistor 31. Alternatively, a combination of a PMOS transistor and an NMOS transistor may be used.

Second Embodiment

Figure 3:
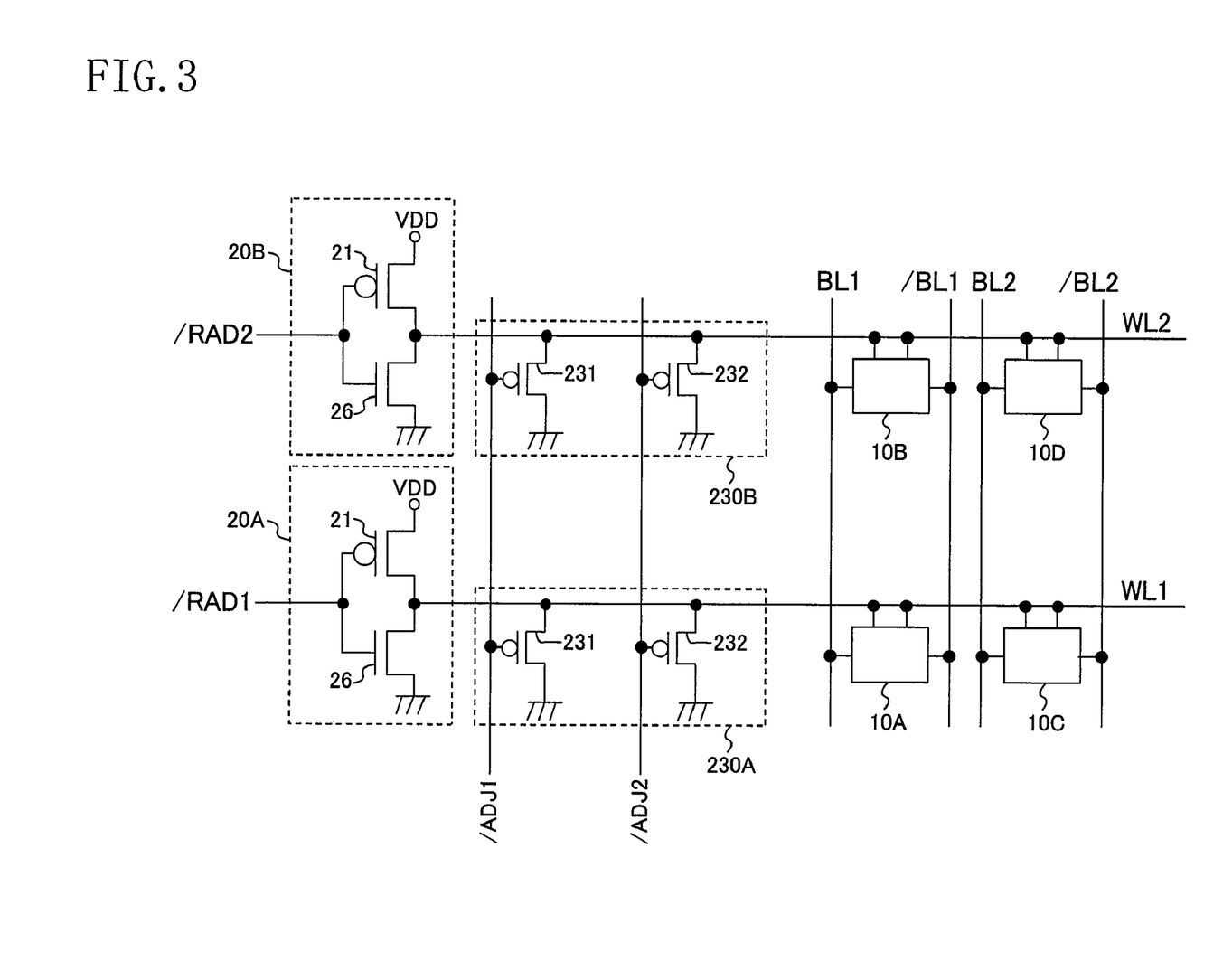
FIG. 3 is a block diagram showing a configuration of a semiconductor integrated circuit according to a second embodiment of the present invention.

FIG. 3 is a block diagram showing a configuration of a semiconductor integrated circuit according to a second embodiment of the present invention. The semiconductor integrated circuit of FIG. 3 is similar to the semiconductor integrated circuit of FIG. 1, except that pull-down circuits 230A and 230B are provided instead of the pull-down circuits 30A and 30B. The other parts are indicated by the same reference symbols and will not be described.

The pull-down circuit 230A has PMOS transistors 231 and 232 as pull-down transistors. In the pull-down circuit 230A, the source terminals of the PMOS transistors 231 and 232 are connected to the word line WL1, and the drain terminals thereof are connected to the ground. Word line voltage adjustment signals /ADJ1 and /ADJ2 are given to the gate terminals of the PMOS transistors 231 and 232, respectively. The pull-down circuit 230B is similar to the pull-down circuit 230A, except that the pull-down circuit 230B is connected to the word line WL2.

Firstly, a case where a word line is in the inactive state (L level) will be described. In this case, since the word lines WL1 and WL2 are at the L level, the PMOS transistors 231 and 232 included in the pull-down circuits 230A and 230B are OFF irrespective of the word line voltage adjustment signals /ADJ1 and /ADJ2. Therefore, the pull-down circuits 230A and 230B do not have an influence on the word lines WL1 and WL2.

Next, a case where a word line goes into the active state (H level) will be described. For example, it is here assumed that the row address signal /RAD1 goes to the L level. When the row address signal /RAD1 goes to the L level, the PMOS transistor 21 included in the word line driver 20A causes the word line WL1 to go to the H level. In this case, the PMOS transistors 231 and 232 included in the pull-down circuit 230A connected to the word line WL1 are controlled by the word line voltage adjustment signals /ADJ1 and /ADJ2.

For example, if both the word line voltage adjustment signals /ADJ1 and /ADJ2 are at the H level, both the PMOS transistors 231 and 232 are switched OFF, so that the voltage of the word line WL1 becomes equal to the power supply voltage VDD.

If the word line voltage adjustment signals /ADJ1 and /ADJ2 are at the H level and at the L level, respectively, the PMOS transistor 232 is switched ON, so that the voltage of the word line WL1 becomes a voltage which is determined by the voltage division ratio of the PMOS transistors 21 and 232.

If both the word line voltage adjustment signals /ADJ1 and /ADJ2 are at the L level, both the PMOS transistors 231 and 232 are switched ON, so that the voltage of the word line WL1 becomes a voltage which is determined by the voltage division ratio of the PMOS transistor 21 and a parallel circuit of the PMOS transistors 231 and 232.

Thus, the voltage of a word line which goes to the H level can be adjusted to various values by a combination of the word line voltage adjustment signals /ADJ1 and /ADJ2.

Characteristics of a memory cell vary depending on a power supply voltage, temperature, process conditions, or the like. According to the semiconductor integrated circuit of FIG. 3, the voltage of a word line can be adjusted by changing a combination of the word line voltage adjustment signals. Therefore, an optimum word line voltage can be easily selected, depending on characteristics of a memory cell.

As described above, in a memory cell of an SRAM, the conductance of an access transistor is generally reduced by causing the high-level voltage of a word line to be lower than the power supply voltage VDD, so that the SNM can be improved. However, since characteristics of a memory cell vary depending on a power supply voltage, temperature, process conditions or the like, the word line voltage may be equal to the power supply voltage VDD. According to the semiconductor integrated circuit of FIG. 3, the high-level voltage of a word line can be equal to the power supply voltage VDD.

In this embodiment, it has been assumed above that the pull-down circuits 230A and 230B include the PMOS transistors 231 and 232, respectively. Instead of the PMOS transistor, an arrangement in which a MOS transistor is connected in series to a resistance element, or an NMOS transistor may be employed. Also, a PMOS transistor and an NMOS transistor may be combined, or a diode-connected MOS transistor, such as the PMOS transistor 31 of FIG. 1, may be used.

The voltage of a word line which goes to the H level is determined by the PMOS transistors 21, 231 and 232 which have the same conductivity type, so that a variation in voltage of the word line WL1 can be minimized.

Also, in the word line driver 20A, an NMOS transistor may be used instead of the PMOS transistor 21. In this case, in the pull-down circuit 230A, NMOS transistors may be used instead of the PMOS transistors 231 and 232. In this case, signals obtained by inverting the word line voltage adjustment signals /ADJ1 and /ADJ2 may be given to the NMOS transistors.

Third Embodiment

Figure 4:
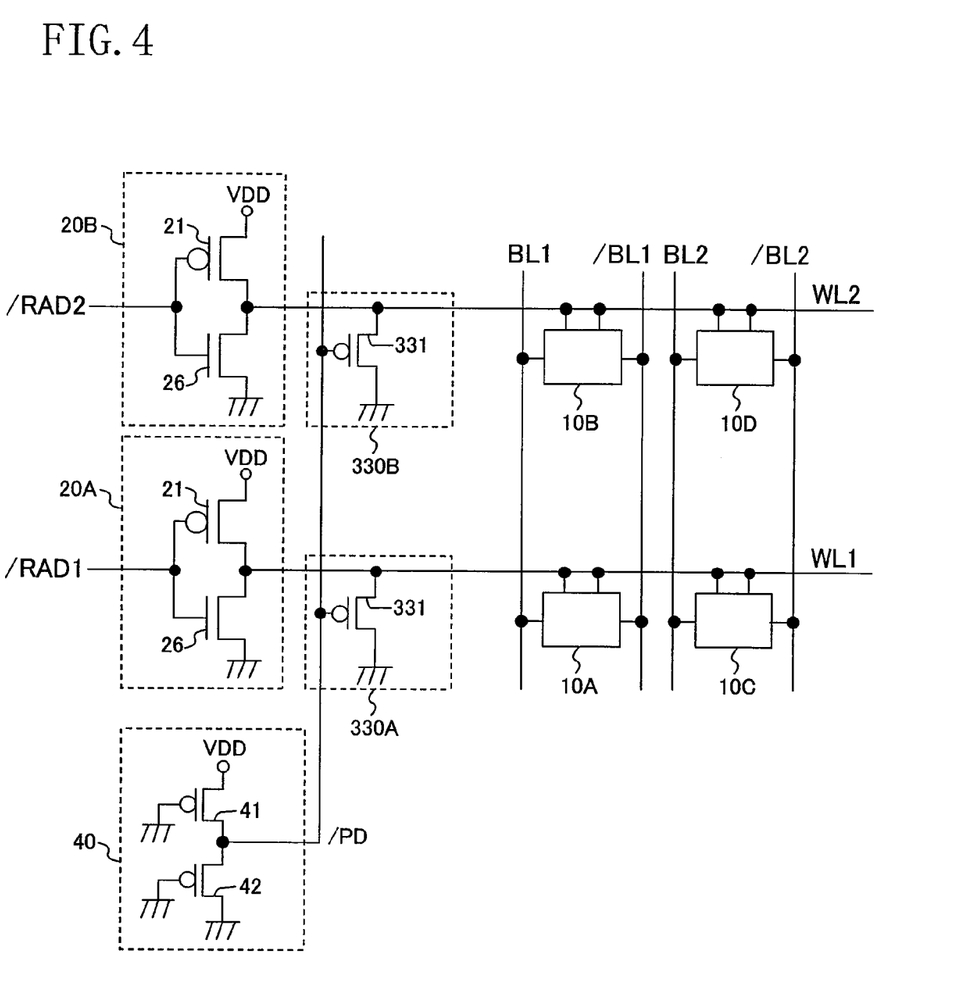
FIG. 4 is a block diagram showing a configuration of a semiconductor integrated circuit according to a third embodiment of the present invention.

FIG. 4 is a block diagram showing a configuration of a semiconductor integrated circuit according to a third embodiment of the present invention. The semiconductor integrated circuit of FIG. 4 is similar to the semiconductor integrated circuit of FIG. 1, except that pull-down circuits 330A and 330B are provided instead of the pull-down circuits 30A and 30B and a pull-down control circuit 40 is further provided. The other parts are indicated by the same reference symbols and will not be described.

The pull-down circuits 330A and 330B each have a PMOS transistor 331 as a pull-down transistor. In the pull-down circuits 330A and 330B, the source terminals of the PMOS transistors 331 are connected to the word lines WL1 and WL2, respectively. A pull-down control signal /PD is given to the gate terminal of the PMOS transistor 331, and the drain terminal thereof is connected to the ground.

The pull-down control circuit 40 has PMOS transistors 41 and 42. The PMOS transistors 41 and 42 are connected in series between a power supply and the ground. The gate terminals of the PMOS transistors 41 and 42 are both connected to the ground. The pull-down control circuit 40 outputs, as the pull-down control signal /PD, a voltage which is determined by the voltage division ratio of the PMOS transistors 41 and 42.

Firstly, a case where a word line is in the inactive state (L level) will be described. In this case, since the word lines WL1 and WL2 are at the L level, the PMOS transistors 331 included in the pull-down circuits 330A and 330B are OFF irrespective of the pull-down control signal /PD. Therefore, the pull-down circuits 330A and 330B do not have an influence on the word lines WL1 and WL2.

Next, a case where a word line is in the active state (H level) will be described. For example, it is here assumed that the row address signal /RAD1 goes to the L level. When the row address signal /RAD1 goes to the L level, the PMOS transistor 21 of the word line driver 20A causes the word line WL1 to go to the H level. In this case, the pull-down control circuit 40 outputs the pull-down control signal /PD, so that the PMOS transistor 331 included in the pull-down circuit 330A is switched ON, and therefore, the voltage of the word line WL1 becomes a voltage which is determined by the voltage division ratio of the PMOS transistor 21 of the word line driver 20A and the PMOS transistor 331 of the pull-down circuit 330A.

Thus, according to the semiconductor integrated circuit of FIG. 4, the voltage of the word line WL1 becomes lower than the power supply voltage VDD, so that the conductance of the access transistor is reduced, resulting in an improvement in SNM.

The voltage of the word line WL1 may be set, depending on the SNM characteristics of the memory cell 10A or the like.

The pull-down control signal /PD is determined by the voltage division ratio of the PMOS transistors 41 and 42, and therefore, can be changed by changing the gate widths W and the gate lengths L of the PMOS transistors 41 and 42. If the pull-down control signal /PD is used to change the capability of the PMOS transistor 331 of the pull-down circuit 330A, the voltage of the word line WL1 can be set to have any value.

Note that, in the pull-down control circuit 40, a word line voltage adjustment signal ADJ1 may be given to the gate of the PMOS transistor 41. Also, a circuit in which a plurality of similar PMOS transistors are arranged in parallel may be used instead of the PMOS transistor 41, and different word line voltage adjustment signals may be given separately to those transistors.

In this embodiment, it has been assumed that the pull-down circuits 330A and 330B each include the PMOS transistor 331. Instead of the PMOS transistor, an arrangement in which a MOS transistor is connected in series to a resistance element, or an NMOS transistor may be employed. Also, a combination of a PMOS transistor and an NMOS transistor may be used, or a diode-connected MOS transistor may be used as is similar to the PMOS transistor 31 of FIG. 1.

The pull-down control signal /PD is determined by the PMOS transistors 41 and 42 having the same conductivity type, so that variations in the voltages of the pull-down control signal /PD and the word line WL1 can be minimized.

Also, in the word line driver 20A, an NMOS transistor may be used instead of the PMOS transistor 21. In this case, in the pull-down circuit 330A, an NMOS transistor may be used instead of the PMOS transistor 331.

Also, two NMOS transistors may be used instead of the PMOS transistors 41 and 42 of the pull-down control circuit 40.

Figure 5:
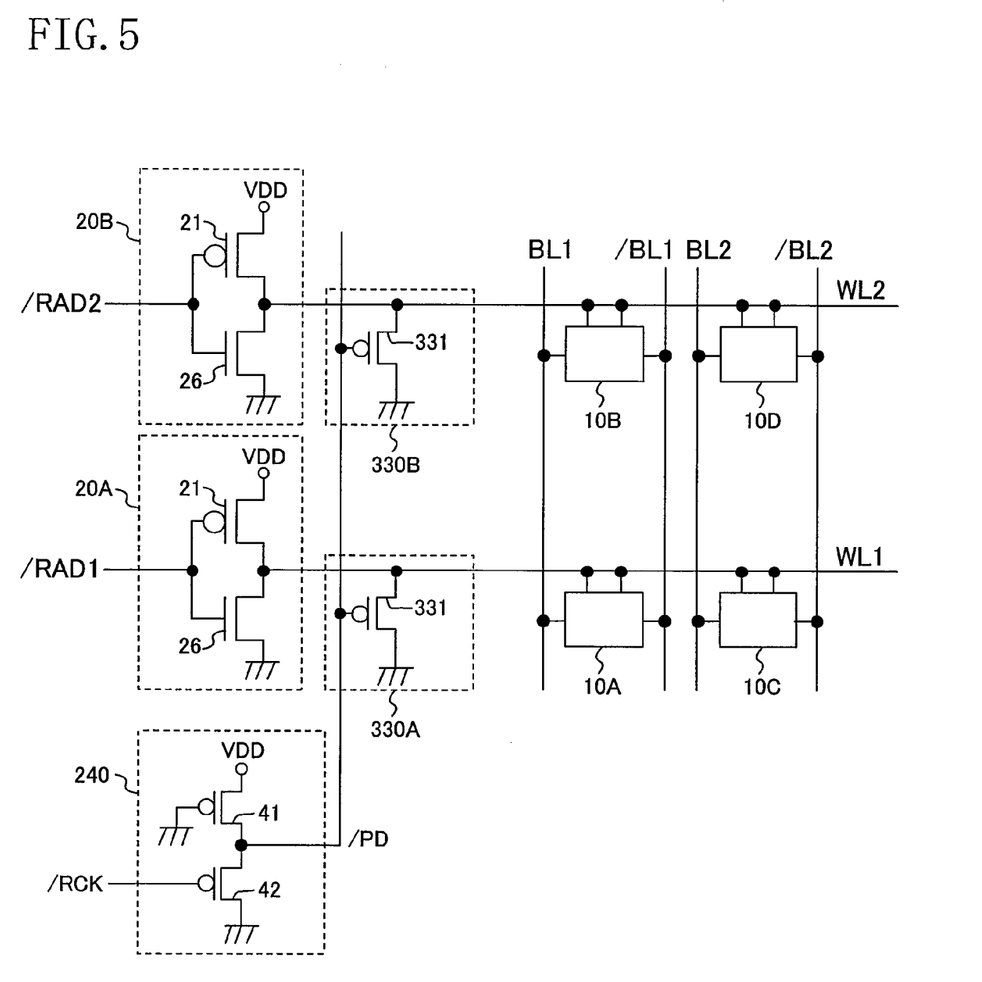
FIG. 5 is a block diagram showing a variation of the semiconductor integrated circuit of the third embodiment.

FIG. 5 is a block diagram showing a variation of the semiconductor integrated circuit of the third embodiment. The semiconductor integrated circuit of FIG. 5 is similar to the semiconductor integrated circuit of FIG. 4, except that a pull-down control circuit 240 is provided instead of the pull-down control circuit 40.

The pull-down control circuit 240 is similar to the pull-down control circuit 40, except that a row clock signal /RCK is given to the gate terminal of the PMOS transistor 42. The row clock signal /RCK is a signal which is synchronous with the row address signal /RAD1 or /RAD2, and is at the L level when any one of word lines is in the active state.

In the pull-down control circuit 240, only when a word line is in the active state, a current flows from the power supply to the ground. In the pull-down control circuit 40 of FIG. 4, a current invariably flows from the power supply to the ground, low power consumption can be achieved in the semiconductor integrated circuit of FIG. 5.

Fourth Embodiment

Figure 6:
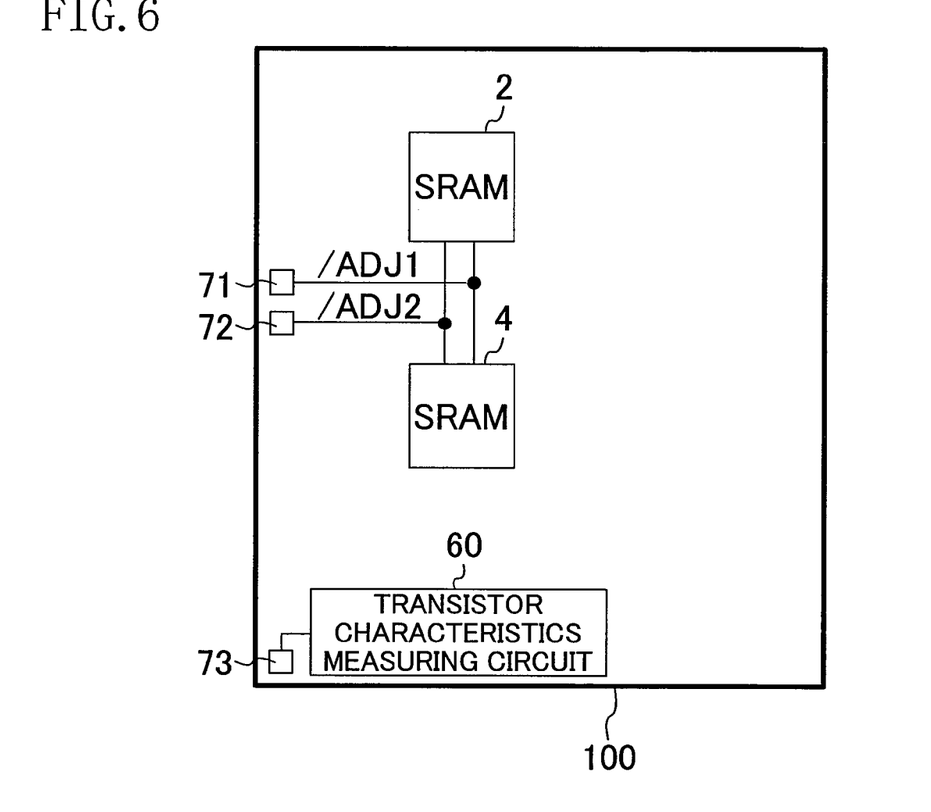
FIG. 6 is a block diagram showing a configuration of a semiconductor integrated circuit according to a fourth embodiment of the present invention.

FIG. 6 is a block diagram showing a configuration of a semiconductor integrated circuit according to a fourth embodiment of the present invention. The semiconductor integrated circuit 100 of FIG. 6 has memory circuits 2 and 4, a transistor-characteristics measuring circuit 60, and input pads 71, 72 and 73. These parts are formed on the same semiconductor substrate. The memory circuits 2 and 4 are each an SRAM memory circuit which performs a control using word line voltage adjustment signals /ADJ1 and /ADJ2 (e.g., the semiconductor integrated circuit of FIG. 3). In FIG. 6, the other input/output terminals which are possessed by a general SRAM (e.g., an address input terminal, a data input/output terminal) are not shown for the sake of simplicity.

The input pads 71 and 72 are connected to the memory circuits 2 and 4. The word line voltage adjustment signals /ADJ1 and /ADJ2 are externally given to the input pads 71 and 72, respectively. The transistor characteristics measuring circuit 60 is a circuit for confirming characteristics of a transistor formed in the semiconductor integrated circuit 100.

Figure 7:
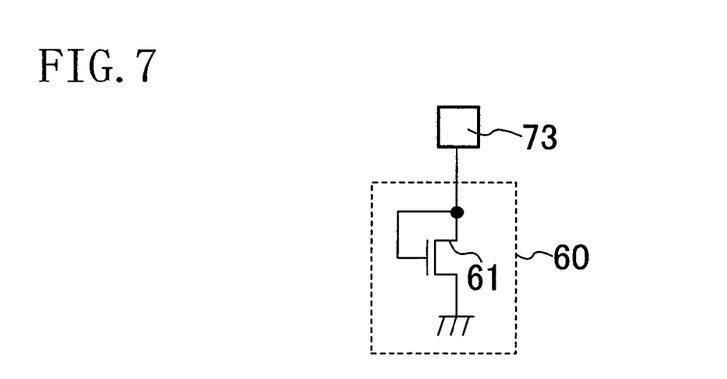
FIG. 7 is a circuit diagram showing an exemplary configuration of a transistor characteristics measuring circuit of FIG. 6.

FIG. 7 is a circuit diagram showing an exemplary configuration of the transistor characteristics measuring circuit of FIG. 6. The transistor characteristics measuring circuit 60 has an NMOS transistor 61 as a transistor for measurement. The drain of the NMOS transistor 61 is connected to the input pad 73, and the source thereof is connected to the ground. The gate and drain of the NMOS transistor 61 are connected to each other (diode-connection).

A current is caused to flow through the input pad 73, and a voltage at that time is measured, thereby making it possible to determine characteristics of the transistor 61. Alternatively, a voltage may be given to the input pad 73, and a current value at that time may be measured, thereby making it possible to determine characteristics of the transistor 61. If a testing device or the like for measuring a semiconductor integrated circuit is used, such measurement can be easily performed.

During test, transistor characteristics of the semiconductor integrated circuit 100 are measured using the transistor characteristics measuring circuit 60, and depending on the result, a combination of the word line voltage adjustment signals /ADJ1 and /ADJ2 is determined so as to appropriately set the word line voltages of the memory circuits 2 and 4.

Thus, according to the semiconductor integrated circuit 100 of FIG. 6, it is possible to generate word line voltages appropriate for the actually formed memory circuits 2 and 4. Also, a semiconductor integrated circuit having a pull-down control circuit to which a plurality of word line voltage adjustment signals are given as described with reference to FIG. 4 may be used as each of the memory circuits 2 and 4. In this case, the pull-down control signal /PD appropriate for the memory circuits 2 and 4 can be generated.

The NMOS transistor 61 of the transistor characteristics measuring circuit 60 preferably has a configuration similar to that of the access transistor 18 or 19 or the drive transistor 16 or 17 included in the memory cell 10A of FIG. 2 (i.e., the size and shape are the same, and the diffusion region, the gate and the like are formed in the same respective layers). The SNM characteristics are characteristics which are determined by a memory cell transistor included in the memory cell 10A since it is correlated with characteristics of an access transistor or a drive transistor. Therefore, if characteristics of a transistor which is formed on the same semiconductor substrate on which a memory cell transistor is formed are measured and the result is used, a word line voltage or a pull-down control signal /PD having a more appropriate value can be generated.

When the SNM characteristics and the load transistor characteristics are correlated with each other, the transistor characteristics measuring circuit 60 may have the load transistor 11 or 12 (PMOS transistor) of the memory cell 10A instead of the NMOS transistor 61. Further, the transistor characteristics measuring circuit 60 may have an access transistor or a drive transistor (NMOS transistor), and a load transistor (PMOS transistor), and characteristics of these transistors may be measured.

Figure 8:
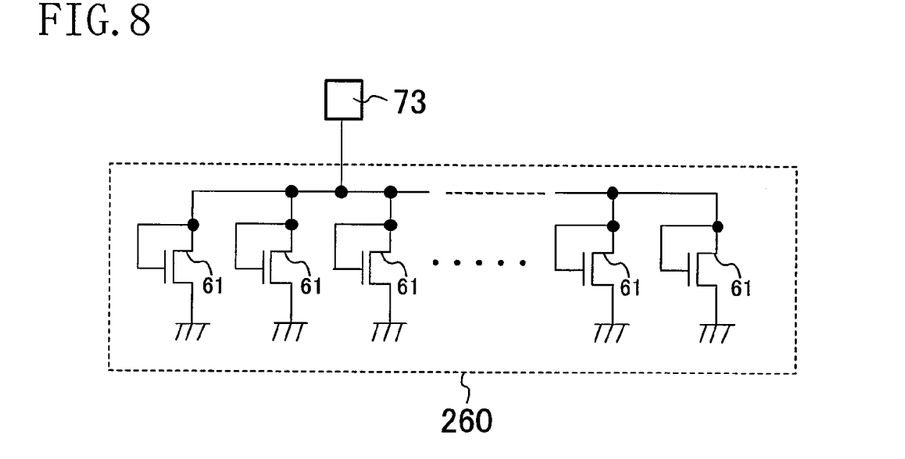
FIG. 8 is a circuit diagram showing another exemplary configuration of the transistor characteristics measuring circuit of FIG. 6.

FIG. 8 is a circuit diagram showing another exemplary configuration of the transistor characteristics measuring circuit of FIG. 6. The transistor characteristics measuring circuit 260 has a plurality of NMOS transistors 61 connected in parallel. The gate and drain of each NMOS transistor 61 are connected to each other.

As the process rule is reduced, variations in transistor characteristics become more significant. Therefore, the transistor characteristics on the same semiconductor substrate can be determined with higher precision when the characteristics of a plurality of transistors are measured than when the characteristics of only a transistor are measured, so that a more appropriate voltage of a word line or a more appropriate pull-down control signal can be generated. Also in the transistor characteristics measuring circuit of FIG. 8, the NMOS transistor 61 desirably has a configuration similar to that of the memory cell transistor of memory cell 10A of FIG. 2.

Figure 9:
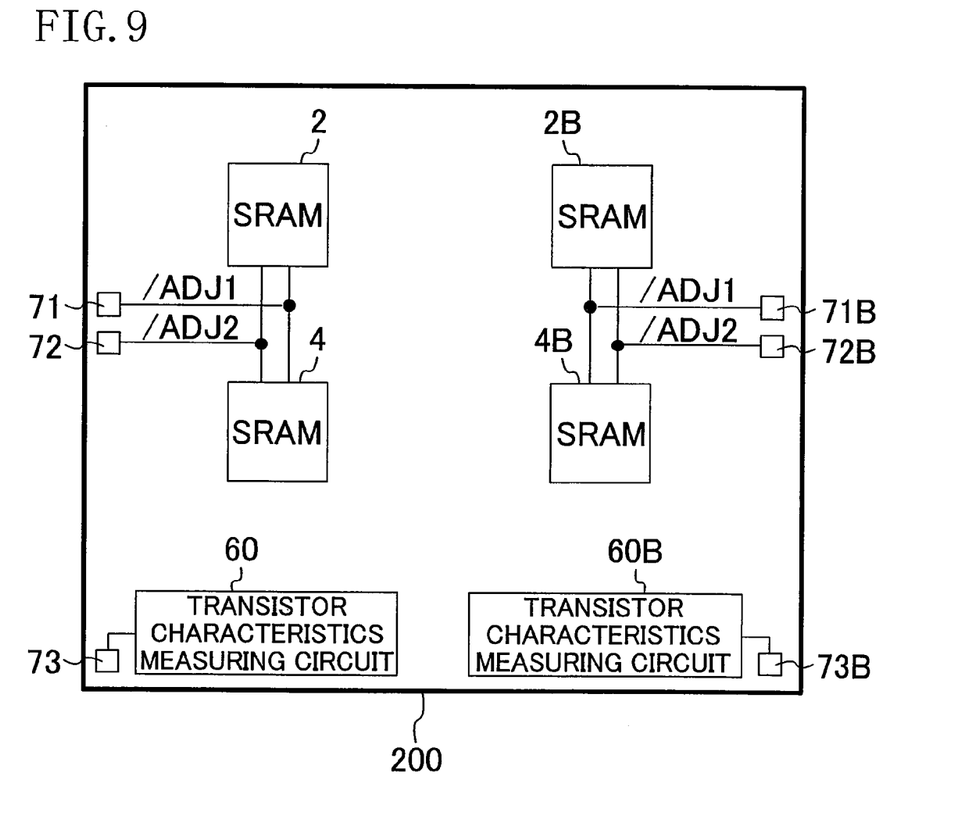
FIG. 9 is a block diagram showing a configuration of a variation of the semiconductor integrated circuit of the fourth embodiment.

FIG. 9 is a block diagram showing a configuration of a variation of the semiconductor integrated circuit of the fourth embodiment. The semiconductor integrated circuit 200 of FIG. 9 is similar to the semiconductor integrated circuit 100 of FIG. 6, except that memory circuits 2B and 4B, a transistor characteristics measuring circuit 60B, and input pads 71B, 72B and 73B are further provided. The parts of the semiconductor integrated circuit 200 are formed on the same semiconductor substrate.

The input pads 71B and 72B are connected to the memory circuits 2B and 4B. The word line voltage adjustment signals /ADJ1 and /ADJ2 are externally given to the input pads 71B and 72B, respectively.

The memory circuits 2B and 4B are each an SRAM memory circuit which performs a control using the word line voltage adjustment signals /ADJ1 and /ADJ2, and have substantially the same configuration as that of the memory circuits 2 and 4. The transistor characteristics measuring circuit 60B has substantially the same configuration as that of the transistor characteristics measuring circuit 60. Note that the threshold voltages of transistors included in the memory circuits 2B and 4B and the transistor characteristics measuring circuit 60B are higher than the threshold voltages of transistors included in the memory circuits 2 and 4 and the transistor characteristics measuring circuit 60.

Thus, the semiconductor integrated circuit 200 includes transistor groups each including a plurality of transistors, where the transistors included in each transistor group have a threshold voltage different from that of the transistors included in the other transistor group, and has transistor characteristics measuring circuits each including a transistor of the respective corresponding transistor groups. If the transistor characteristics of each transistor characteristics measuring circuit are measured externally to the semiconductor integrated circuit 200, the result can be used to generate a word line voltage appropriate for each transistor group, or a pull-down control signal.

Also, in each of the above-described embodiments, the semiconductor integrated circuit may have a compilable memory in which the number of words or the number of bits is variable (memory compiler).

If the number of words or the number of bits (i.e., the memory capacity) is changed, the load of a word line is also changed. Therefore, the capability of a word line driver to drive a word line may be set, depending on the number of bits which can be stored in a plurality of memory cells. In order to change the drive capability of the word line driver, the gate width W of the PMOS transistor 21 included in the word line driver 20A or the like may be increased or decreased in the semiconductor integrated circuit of FIG. 1 or the like.

In general, when the number of words or the number of bits is small (the memory capacity is small), the load of a word line or a bit line is small, and therefore, a period of time during which a word line is in the active state may be short. Conversely, when the number of words or the number of bits is large (the memory capacity is large), the period of time during which a word line is in the active state needs to be long. Therefore, the word line driver may set the length of a period of time during which any word line is in the active state, depending on the number of bits which can be stored in a plurality of memory cells.

When a word line is in the active state, a DC current flows from a PMOS transistor included in a word line driver to a pull-down transistor. Therefore, by optimizing the period of time during which a word line is in the active state, an unnecessary DC current can be suppressed, thereby making it possible to achieve low power consumption of a semiconductor integrated circuit.

Also, in the pull-down circuit 30A or the like, the level of the drive capability may be set so as to correspond to the drive capability of the word line driver 20A or the like (the drive capability of the PMOS transistor 21). This is because the voltage of a word line is determined by the voltage division ratio of the PMOS transistor 21 and the pull-down circuit. In order to cause the voltage of a word line to be constant irrespective of the number of words or the number of bits, the drive capability of the pull-down transistor may be set to be high when the drive capability of the PMOS transistor 21 is high, for example.

Thus, the optimization of the capability of a word line driver and a pull-down transistor depending on the number of words or the number of bits of a memory is equivalent to the optimization of a layout area or a DC current. In other words, the area and power consumption of a semiconductor integrated circuit can be reduced.

As described above, the present invention can improve the static noise margin of a memory cell, and therefore, is useful as, for example, a semiconductor integrated circuit having a flip-flop memory cell.

What is claimed is:

1. A semiconductor integrated circuit comprising:
   a plurality of memory cells arranged in a matrix;
   a plurality of word lines corresponding to respective rows of the plurality of memory cells;
   a plurality of word line drivers for driving the plurality of word lines, respectively; and
   a plurality of pull-down circuits connected to the plurality of word lines, respectively, for causing voltages of the respective connected word lines to be lower than or equal to a power supply voltage when the respective word lines are in an active state,
   wherein the plurality of word line drivers each has a PMOS transistor for causing the corresponding word line to go into the active state, and
   the plurality of pull-down circuits each has a PMOS pull-down transistor for pulling down a voltage of the corresponding word line.

2. The semiconductor integrated circuit of claim 1, wherein the PMOS pull-down transistor is controlled in accordance with a word line voltage adjustment signal given to a gate terminal thereof.

3. The semiconductor integrated circuit of claim 2, wherein the plurality of pull-down circuits each includes a plurality of the PMOS pull-down transistors, and different word line voltage adjustment signals are input separately to the gate terminals of the plurality of PMOS pull-down transistors possessed by each of the plurality of pull-down circuits.

4. The semiconductor integrated circuit of claim 2, wherein the PMOS pull-down transistor is caused to go into a non-conductive state in accordance with the word line voltage adjustment signal.

5. The semiconductor integrated circuit of claim 2, further comprising:
   a pull-down control circuit having a plurality of transistors having the same conductivity type connected in series, for outputting the word line voltage adjustment signal from a node between each of the transistors connected in series.

6. The semiconductor integrated circuit of claim 5, wherein the pull-down control circuit outputs the word line voltage adjustment signal for causing the PMOS pull-down transistor to be conductive when any of the plurality of word lines is in the active state.

7. The semiconductor integrated circuit of claim 2, further comprising:
   a transistor characteristics measuring circuit having a measuring transistor on the same semiconductor substrate on which the semiconductor integrated circuit is provided.

8. The semiconductor integrated circuit of claim 7, wherein the measuring transistor is a transistor having a configuration similar to that of the transistors included in the plurality of memory cells.

9. The semiconductor integrated circuit of claim 8, wherein the transistor characteristics measuring circuit has a plurality of the measuring transistor, and the plurality of measuring transistors are connected in parallel.

10. The semiconductor integrated circuit of claim 7, further comprising:
    an additional transistor characteristics measuring circuit the same as the transistor characteristics measuring circuit,
    wherein the transistor characteristics measuring circuits correspond to respective transistor groups each having a plurality of transistors included in the semiconductor integrated circuit, and
    the transistors included in each transistor group have a threshold voltage different from that of the transistors included in the other transistor group.

11. The semiconductor integrated circuit of claim 1, wherein
    the word line driver causes a period of time during which any of the plurality of word lines is in the active state to have a length corresponding to the number of bits which can be stored in the plurality of memory cells.

12. The semiconductor integrated circuit of claim 1, wherein
    the plurality of pull-down circuits causes drive capability thereof to have a level corresponding to the number of bits which can be stored in the plurality of memory cells.

* * * * *